US008956946B2

(12) United States Patent
Tang et al.

(10) Patent No.: US 8,956,946 B2
(45) Date of Patent: Feb. 17, 2015

(54) ACTIVE PAD PATTERNS FOR GATE ALIGNMENT MARKS

(71) Applicants: Ming Hao Tang, Singapore (SG); Michael Hsieh, Saratoga Springs, NY (US); Frank Kahlenberg, Dresden (DE)

(72) Inventors: Ming Hao Tang, Singapore (SG); Michael Hsieh, Saratoga Springs, NY (US); Frank Kahlenberg, Dresden (DE)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 76 days.

(21) Appl. No.: 13/721,611

(22) Filed: Dec. 20, 2012

(65) Prior Publication Data

US 2014/0175594 A1      Jun. 26, 2014

(51) Int. Cl.
*H01L 23/544* (2006.01)
*G03F 9/00* (2006.01)

(52) U.S. Cl.
CPC ............ *H01L 23/544* (2013.01); *G03F 9/7073* (2013.01); *G03F 9/7084* (2013.01)
USPC ................... 438/401; 257/797; 257/E23.179

(58) Field of Classification Search
CPC .................. H01L 23/544; H01L 23/54426
USPC .............. 257/797, E23.179; 438/401
See application file for complete search history.

(56) References Cited

U.S. PATENT DOCUMENTS

| | | | |
|---|---|---|---|
| 2002/0102811 A1* | 8/2002 | Farrow et al. | 438/401 |
| 2002/0197812 A1* | 12/2002 | Fan | 438/369 |
| 2011/0156286 A1* | 6/2011 | Ushida et al. | 257/797 |
| 2012/0248603 A1* | 10/2012 | Koketsu et al. | 257/737 |

* cited by examiner

*Primary Examiner* — Steven J Fulk
(74) *Attorney, Agent, or Firm* — Ditthavong & Steiner, P.C.

(57) ABSTRACT

Methods for forming RX pads having gate alignment marks configured to enable noise reduction between layers while resulting in little or no non-uniformity of CMP processes for the IC, and the resulting devices, are disclosed. Embodiments include: providing, on a substrate, a RX pad having a SPM with a SPM horizontal and vertical positions at horizontal and vertical midpoints, respectively, of the first RX pad; providing a second RX pad abutting the first RX pad and a first STI pad abutting the second RX pad, each having a vertical midpoint at the SPM vertical position; forming a first gate alignment mark on the second RX pad and having vertical endpoints horizontally aligned with vertical endpoints of the second RX pad; and forming a second gate alignment mark on the first STI pad and having vertical endpoints horizontally aligned with vertical endpoints of the first STI pad.

10 Claims, 4 Drawing Sheets

US 8,956,946 B2

ACTIVE PAD PATTERNS FOR GATE ALIGNMENT MARKS

TECHNICAL FIELD

The present disclosure relates to a formation of an active (RX) pattern for a gate alignment mark in an integrated circuit (IC). The present disclosure is particularly applicable to gate alignment marks using a scribe line primary mark (SPM) in 180 nanometer (nm) technology nodes and beyond.

BACKGROUND

Most advanced exposure tools employ an ASML scanner, which requires a SPM to align a current layer to a previous layer in the fabrication of semiconductor devices. Traditional methods use an RX pad to reduce noise from a previous layer when using SPM alignment marks to align the current layer with the previous layer. However, traditional methods require a large RX pad size, for instance, a 40 micron (μm) by 436.6 μm pad for a narrow short-scribe-lane primary mark in order to effectively reduce noise between layers. As such, traditional methods using a SPM and RX pad exceed design rules checks for maximum pad size, for instance, 50 μm by 50 μm, and cause non-uniformity of chemical-mechanical planarization (CMP) processes for the IC. Furthermore, as feature sizes continue to decrease, so increases the importance of uniformity of CMP processes for the IC. Some traditional methods attempt to solve the CMP non-uniformity issues by using a large shallow trench isolation (STI) pad. However, the large STI pad causes a dishing of polish oxide, and is thus ineffective.

A need therefore exists for an RX pad for use with gate alignment marks configured to enable sufficient filtering of noise between layers while resulting in little or no non-uniformity of CMP processes for the IC.

SUMMARY

An aspect of the present disclosure is a method of forming gate alignment marks having vertical endpoints horizontally aligned with both vertical endpoints of RX pads and vertical endpoints STI pads.

Another aspect of the present disclosure is an apparatus having gate alignment marks having vertical endpoints horizontally aligned with vertical endpoints of RX pads and gate alignment marks having vertical endpoints horizontally aligned with vertical endpoints STI pads.

An aspect of the present disclosure is a method of forming gate alignment marks extending in a vertical direction on RX and STI pads extending in a horizontal direction.

Another aspect of the present disclosure is an apparatus having gate alignment marks extending in a vertical direction on RX and STI pads extending in a horizontal direction.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing, on a substrate, a first RX pad having a SPM with a SPM horizontal position at horizontal midpoint of the first RX pad and a SPM vertical position at a vertical midpoint of the first RX pad; providing a second RX pad abutting the first RX pad having a vertical midpoint at the SPM vertical position; providing a first STI pad abutting the second RX pad and having a vertical midpoint at the SPM vertical position; forming a first gate alignment mark on the second RX pad and having vertical endpoints horizontally aligned with vertical endpoints of the second RX pad; and forming a second gate alignment mark on the first STI pad and having vertical endpoints horizontally aligned with vertical endpoints of the first STI pad.

Aspects include providing the first STI pad and the second RX pad with equal horizontal pitches. Some aspects include: forming, on the second RX pad, a first set of gate alignment marks including the first gate alignment mark and a gate alignment mark on each side of the first gate alignment mark having a vertical length and vertical midpoint equal to the first gate alignment mark, the first set of gate alignment marks having a gate alignment mark set horizontal pitch; forming, on the first STI pad, a second set of gate alignment marks including the second gate alignment mark and a gate alignment mark on each side of the second gate alignment mark having a vertical length and vertical midpoint equal to the second gate alignment mark, the second gate alignment mark set having the gate alignment mark set horizontal pitch; and providing the first STI pad and the second RX pad with horizontal pitches according to the gate alignment mark set horizontal pitch. Additional aspects include providing the first RX pad with a horizontal pitch according to the gate alignment mark set horizontal pitch. Further aspects include: providing the first STI pad and the second RX pad with horizontal pitches of twice the gate alignment mark set horizontal pitch; and providing the first RX pad with a horizontal pitch of four times the gate alignment mark set horizontal pitch. Some aspects include: providing a third RX pad abutting the first RX pad having a vertical midpoint at the SPM vertical position, the third RX pad having a horizontal pitch of twice the gate alignment mark set horizontal pitch; and providing a second STI pad abutting the third RX pad and having a vertical midpoint at the SPM vertical position, the second STI pad having a horizontal pitch of twice the gate alignment mark set horizontal pitch.

Another aspect of the present disclosure is an apparatus having: a first RX pad on a substrate having a SPM with a SPM horizontal position at horizontal midpoint of the first RX pad and a SPM vertical position at a vertical midpoint of the first RX pad; a second RX pad abutting the first RX pad having a vertical midpoint at the SPM vertical position; a first STI pad abutting the second RX pad and having a vertical midpoint at the SPM vertical position; a first gate alignment mark on the second RX pad and having vertical endpoints horizontally aligned with vertical endpoints of the second RX pad; and a second gate alignment mark on the first STI pad and having vertical endpoints horizontally aligned with vertical endpoints of the first STI pad.

Aspects include an apparatus, wherein the first STI pad and the second RX pad have equal horizontal pitches. Some aspects include: an apparatus including: a first set of gate alignment marks in the second RX pad including the first gate alignment mark and a gate alignment mark on each side of the first gate alignment mark having a vertical length and vertical midpoint equal to the first gate alignment mark, the first set of gate alignment marks having a gate alignment mark set horizontal pitch; a second set of gate alignment marks in the first STI pad including the second gate alignment mark and a gate alignment mark on each side of the second gate alignment mark having a vertical length and vertical midpoint equal to the second gate alignment mark, the second gate alignment mark set having the gate alignment mark set horizontal pitch, wherein the first STI pad and the second RX pad have horizontal pitches according to the gate alignment mark set horizontal pitch. Additional aspects include an apparatus, wherein the first RX pad has a horizontal pitch according to the gate alignment mark set horizontal pitch. Further aspects include an apparatus, wherein the first STI pad and the second RX pad have horizontal pitches of twice the gate alignment mark set horizontal pitch and the first RX pad has a horizontal pitch of four times the gate alignment mark set horizontal pitch. Some aspects include an apparatus including: a third RX pad abutting the first RX pad having a vertical midpoint at the SPM vertical position, the third RX pad having a horizontal pitch of twice the gate alignment mark set horizontal pitch; and a second STI pad abutting the third RX pad and having a vertical midpoint at the SPM vertical position, the second STI pad having a horizontal pitch of twice the gate alignment mark set horizontal pitch.

Another aspect of the present disclosure is a method including: providing on a substrate first and second RX pads each extending in a horizontal direction; providing on the substrate a first STI pad extending in the horizontal direction, separating the first and second RX pads; providing a SPM centered horizontally and vertically on the first RX pad; and forming a plurality of gate alignment marks on the first and second RX pads and the first STI pad, each of the gate alignment marks extending in a vertical direction, and each having an endpoint on a horizontal edge of the second RX pad.

Aspects include: providing on the substrate a third RX pad extending in the horizontal direction; and providing on the substrate a second STI pad extending in the horizontal direction, the second STI pad separating the first and third RX pads, the gate alignment marks each having a second endpoint on a horizontal edge of the third RX pad. Further aspects include a method, wherein the gate alignment marks include a plurality of sets of gate alignment marks, each of the sets of gate alignment marks having a first gate alignment mark positioned at a horizontal midpoint of a set of gate alignment marks with gate alignment marks positioned on each side of the first gate alignment mark, the method further including: forming a first set of gate alignment marks separated by a first distance from the SPM along the horizontal direction; forming a second set of gate alignment marks separated by a second distance from the first set of gate alignment marks along the horizontal direction; and forming a third set of gate alignment marks separated by the second distance from the second set of gate alignment marks along the horizontal direction. Some aspects include: forming a fourth set of gate alignment marks being separated by the first distance from the SPM along the horizontal direction; forming a fifth set of gate alignment marks separated by the second distance from the fourth set of gate alignment marks along the horizontal direction; and forming a sixth set of gate alignment marks separated by the second distance from the fifth set of gate alignment marks along the horizontal direction.

Another aspects of the present disclosure is an apparatus having: first and second RX pads on a substrate, each extending in a horizontal direction; a first STI pad on the substrate extending in the horizontal direction, separating the first and second RX pads; a SPM centered horizontally and vertically on the first RX pad; and a plurality of gate alignment marks on the first and second RX pads and the first STI pad, each of the gate alignment marks extending in a vertical direction, and each having an endpoint on a horizontal edge of the second RX pad.

Aspects include an apparatus having: a third RX pad on the substrate extending in the horizontal direction; and a second STI pad on the substrate extending in the horizontal direction, the second STI pad separating the first and third RX pads, the gate alignment marks each having a second endpoint on a horizontal edge of the third RX pad. Further aspects include an apparatus, wherein the gate alignment marks include a plurality of sets of gate alignment marks, each of the sets of gate alignment marks having a first gate alignment mark positioned at a horizontal midpoint of a set of gate alignment marks with gate alignment marks positioned on each side of the first gate alignment mark, the apparatus further including: a first set of gate alignment marks separated by a first distance from the SPM along the horizontal direction; a second set of gate alignment marks separated by a second distance from the first set of gate alignment marks along the horizontal direction; and a third set of gate alignment marks separated by the second distance from the second set of gate alignment marks along the horizontal direction. Some aspects include an apparatus having: a fourth set of gate alignment marks being separated by the first distance from the SPM along the horizontal direction; a fifth set of gate alignment marks separated by the second distance from the fourth set of gate alignment marks along the horizontal direction; and a sixth set of gate alignment marks separated by the second distance from the fifth set of gate alignment marks along the horizontal direction.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of CMP non-uniformity and/or CMP dishing attendant upon IC devices having a SPM and gate alignment marks for aligning consecutive layers. In accordance with embodiments of the present disclosure, the problems are solved, for instance by, inter alia, forming gate alignment marks having vertical endpoints horizontally aligned with vertical endpoints of RX pads and STI pads, or by, inter alia, forming gate alignment marks vertically on RX and STI pads extending in a horizontal direction.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
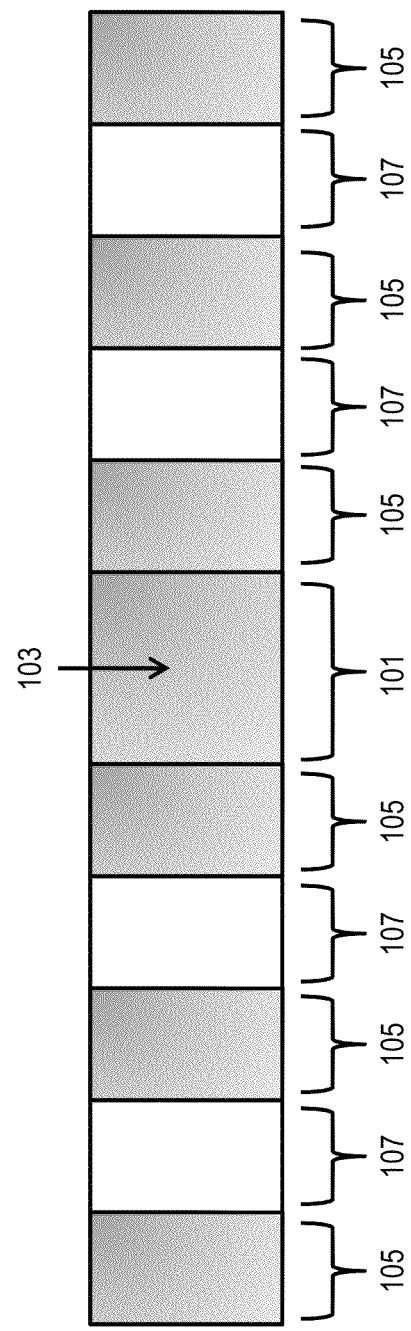
FIGS. 1 and 2 schematically illustrate an RX pad split into multiple segments extending in a vertical direction to reduce noise between layers and allowing for little or no non-uniformity of CMP processes for an IC, in accordance with an exemplary embodiment.
Figure 2:
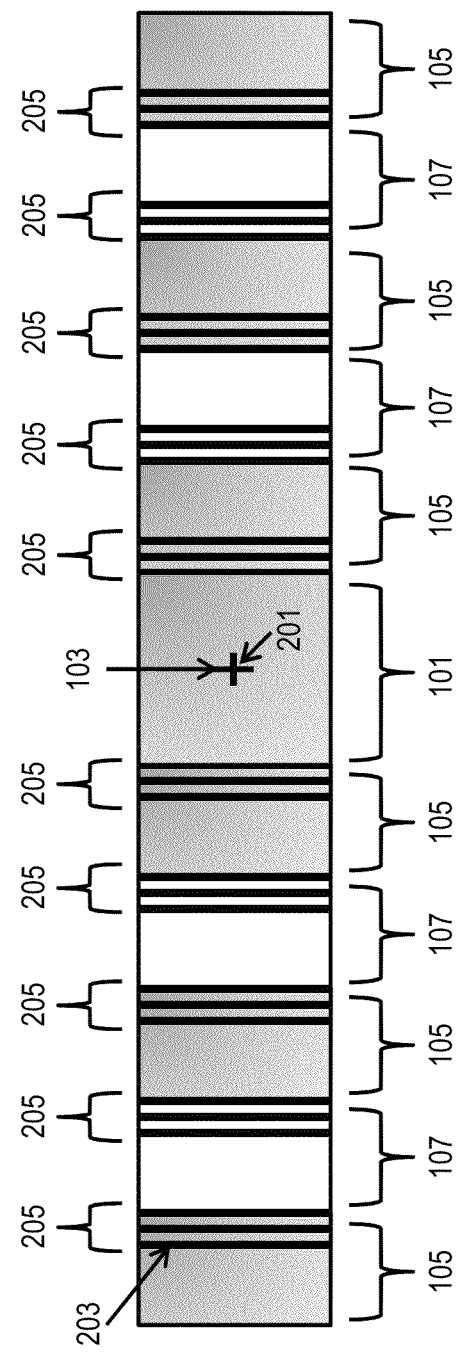

FIGS. 1 and 2 schematically illustrate an RX pad split into multiple segments extending in a vertical direction to reduce noise between layers and allowing for little or no non-uniformity of CMP processes for an IC, in accordance with an exemplary embodiment. Adverting to FIG. 1, a substrate 100 includes an RX pad 101 having a vertical midpoint 103. As shown, RX pads 105 and STI pads 107 have equal vertical midpoints centered at the vertical midpoint 103 and have equal vertical lengths. Additionally, the RX pads 105 and STI pads 107 have equal horizontal pitches. As shown, the RX pads 105 and STI pads 107 to the left of RX pad 101 have horizontal pitches of 32 μm and the RX pads 105 and STI pads 107 to the right of RX pad 101 have horizontal pitches of 35.2 μm.

Adverting to FIG. 2, a SPM 201 is formed on the vertical midpoint 103 and a horizontal midpoint of RX pad 101 but on a different layer and gate alignment marks 203 are formed on the RX pads 105 and STI pads 107 having vertical endpoints horizontally aligned with vertical endpoints of the RX pads 105 and STI pads 107. As shown, the gate alignment marks 203 form gate alignment mark sets 205 having a first gate alignment mark and a gate alignment mark on each side of the first gate alignment mark with a vertical length and vertical midpoint equal to the first gate alignment mark. The gate alignment mark horizontal pitch within a gate alignment mark set equals, for example, half of the horizontal pitches of RX pads 105 and STI pads 107. As illustrated in FIG. 2, each of the sets 205 is positioned on either an RX pad 105 or a STI pad 107, but not both. The RX pads 105 and STI pads 107 have horizontal pitches selected to reduce the impact of RX scattering on gate alignment signals by, for example, sizing the horizontal pitch of RX pads 105 and STI pads 107 as twice the gate alignment mark set horizontal pitch. As the scattering effect can be represented by a Fourier transform, the resulting scattering effect is reduced by sizing horizontal pitches of RX pads 105 and STI pads 107 according to the gate alignment mark horizontal pitch within an alignment mark set. For example, the horizontal pitches of RX pads 105 and STI pads 107 may be sized to be a multiple of the horizontal pitch within a gate alignment mark set, for example, twice, triple, etc, to effectively filter odd harmonics of the resulting scattering effect. Further, the RX pads 105 and STI pads 107 may be configured to cause little or no non-uniformity in CMP processes for the IC, for instance, by sizing horizontal pitches to less than 50 μm.

Figure 3:
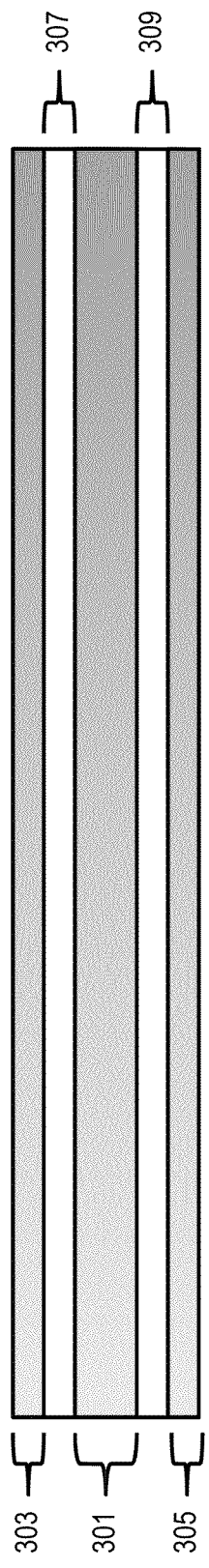
FIGS. 3 and 4 schematically illustrate an RX pad split into multiple segments extending in a horizontal direction to reduce noise between layers and allowing for little or no non-uniformity of CMP processes for an IC, in accordance with an exemplary embodiment.
Figure 4:
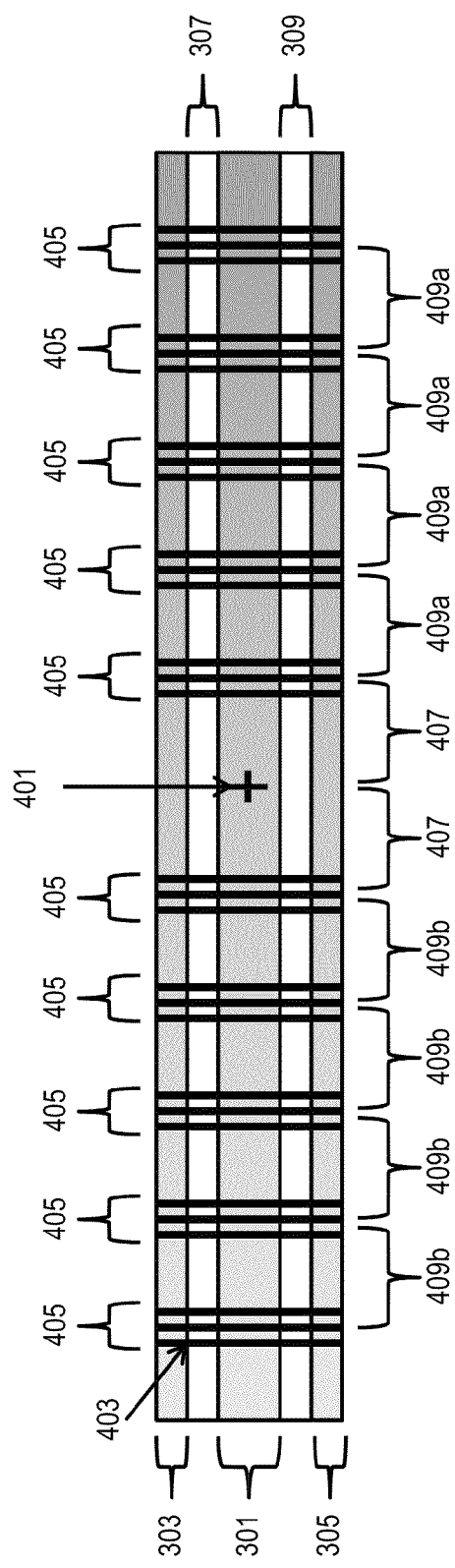

FIGS. 3 and 4 schematically illustrate an RX pad split into multiple segments extending in a horizontal direction to reduce noise between layers and allowing for little or no non-uniformity of CMP processes for an IC, in accordance with an exemplary embodiment. Adverting to FIG. 3, a substrate 300 includes RX pad 301 and being separated from RX pads 303 and 305 by STI pads 307 and 309, respectively. As shown, the RX pads 301, 303, and 305 and STI pads 307 and 309 extend in a horizontal direction. The RX pad 301 may have a vertical pitch of, for instance, 5 μm to 40 μm and the STI pads 307 and 309 may have a vertical pitch of, for instance, 250 nm to 500 nm.

Adverting to FIG. 4, a SPM 401 is formed centered vertically and horizontally on RX pad 301 but on a different layer and each or the gate alignment marks 403 are formed on the RX pads 301, 303, and 305 and STI pads 307 and 309 and have vertical endpoints horizontally aligned along outside horizontal edges the RX pads 303 and 305, respectively. As shown, the gate alignment marks 403 form gate alignment mark sets 405 having a first gate alignment mark and a gate alignment mark on each side of the first gate alignment mark with a vertical length and vertical midpoint equal to the first gate alignment mark. Each of the sets 405 is separated from SPM 401 by at least a distance 407 and from each other by at least a distance 409. Specifically, a first set 405 is separated by distance 407 from SPM 401, a second set 405 is separated by a distance 409a from the first set, a third set 405 is separated by distance 409a from the second set, etc. Similarly, a fourth set 405 is separated by distance 407 from SPM 401, a fifth set 405 is separated by a distance 409b from the fourth set, a sixth set 405 is separated by a distance 409b from the fifth set, etc. As shown, the distances 409a and 409b are 17.6 μm and 16 μm, respectively. Since RX pad 305 and gate alignment marks 403 are perpendicular, the RX pad scattering effect on gate alignment signals is eliminated, as the RX pad scattering has no first order and high order signals to influence gate alignment mark scattering information. Thus, gate alignment mark signals have the same phase, which may easily be filtered. Further, the RX pads 301, 303, and 305 and STI pads 307 and 309 may be configured to cause little or no non-uniformity in CMP processes for the IC, for instance, by sizing vertical pitches to less than 50 μm.

The embodiments of the present disclosure can achieve several technical effects, including fabrication of an IC having SPM and gate alignment marks with little or no CMP non-uniformity. The present disclosure enjoys industrial applicability in any circuit design using SPM and gate alignment marks for aligning layers, particularly for 180 nm manufacturing technologies and below.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing, on a substrate, a first active (RX) pad having a scribe line primary mark (SPM) with a SPM horizontal position at horizontal midpoint of the first RX pad and a SPM vertical position at a vertical midpoint of the first RX pad;

providing a second RX pad abutting the first RX pad having a vertical midpoint at the SPM vertical position;
providing a first shallow trench isolation (STI) pad abutting the second RX pad and having a vertical midpoint at the SPM vertical position;
forming a first gate alignment mark on the second RX pad and having vertical endpoints horizontally aligned with vertical endpoints of the second RX pad; and
forming a second gate alignment mark on the first STI pad and having vertical endpoints horizontally aligned with vertical endpoints of the first STI pad.

2. The method according to claim 1, further comprising:
providing the first STI pad and the second RX pad with equal horizontal pitches.

3. The method according to claim 1, comprising:
forming, on the second RX pad, a first set of gate alignment marks comprising the first gate alignment mark and a gate alignment mark on each side of the first gate alignment mark having a vertical length and vertical midpoint equal to the first gate alignment mark, the first set of gate alignment marks having a gate alignment mark set horizontal pitch;
forming, on the first STI pad, a second set of gate alignment marks comprising the second gate alignment mark and a gate alignment mark on each side of the second gate alignment mark having a vertical length and vertical midpoint equal to the second gate alignment mark, the second gate alignment mark set having the gate alignment mark set horizontal pitch; and
providing the first STI pad and the second RX pad with horizontal pitches according to the gate alignment mark set horizontal pitch.

4. The method according to claim 3, further comprising:
providing the first RX pad with a horizontal pitch according to the gate alignment mark set horizontal pitch.

5. The method according to claim 4, further comprising:
providing the first STI pad and the second RX pad with horizontal pitches of twice the gate alignment mark set horizontal pitch; and
providing the first RX pad with a horizontal pitch of four times the gate alignment mark set horizontal pitch.

6. The method according to claim 5, further comprising:
providing a third RX pad abutting the first RX pad having a vertical midpoint at the SPM vertical position, the third RX pad having a horizontal pitch of twice the gate alignment mark set horizontal pitch; and
providing a second STI pad abutting the third RX pad and having a vertical midpoint at the SPM vertical position, the second STI pad having a horizontal pitch of twice the gate alignment mark set horizontal pitch.

7. A method comprising:
providing on a substrate first and second active (RX) pads each extending in a horizontal direction;
providing on the substrate a first shallow trench isolation (STI) pad extending in the horizontal direction, separating the first and second RX pads;
providing a scribe line primary mark (SPM) centered horizontally and vertically on the first RX pad; and
forming a plurality of gate alignment marks on the first and second RX pads and the first STI pad, each of the gate alignment marks extending in a vertical direction, and each having an endpoint on a horizontal edge of the second RX pad.

8. The method according to claim 7, comprising:
providing on the substrate a third RX pad extending in the horizontal direction; and
providing on the substrate a second STI pad extending in the horizontal direction, the second STI pad separating the first and third RX pads, the gate alignment marks each having a second endpoint on a horizontal edge of the third RX pad.

9. The method according to claim 8, wherein the gate alignment marks include a plurality of sets of gate alignment marks, each of the sets of gate alignment marks having a first gate alignment mark positioned at a horizontal midpoint of a set of gate alignment marks with gate alignment marks positioned on each side of the first gate alignment mark, the method further comprising:
forming a first set of gate alignment marks separated by a first distance from the SPM along the horizontal direction;
forming a second set of gate alignment marks separated by a second distance from the first set of gate alignment marks along the horizontal direction; and
forming a third set of gate alignment marks separated by the second distance from the second set of gate alignment marks along the horizontal direction.

10. The method according to claim 9, comprising:
forming a fourth set of gate alignment marks being separated by the first distance from the SPM along the horizontal direction;
forming a fifth set of gate alignment marks separated by the second distance from the fourth set of gate alignment marks along the horizontal direction; and
forming a sixth set of gate alignment marks separated by the second distance from the fifth set of gate alignment marks along the horizontal direction.

* * * * *